(12) United States Patent
Takahashi et al.

(10) Patent No.: US 9,850,413 B2
(45) Date of Patent: Dec. 26, 2017

(54) ABRASIVE PARTICLES AND PRODUCTION METHOD THEREOF

(71) Applicant: KONICA MINOLTA, INC., Chiyoda-ku (JP)

(72) Inventors: Atsushi Takahashi, Musashino (JP); Natsuki Ito, Hachioji (JP); Akihiro Maezawa, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 279 days.

(21) Appl. No.: 14/406,143

(22) PCT Filed: Jun. 10, 2013

(86) PCT No.: PCT/JP2013/065939
§ 371 (c)(1),
(2) Date: Dec. 5, 2014

(87) PCT Pub. No.: WO2013/187354
PCT Pub. Date: Dec. 19, 2013

(65) Prior Publication Data
US 2015/0175864 A1 Jun. 25, 2015

(30) Foreign Application Priority Data
Jun. 13, 2012 (JP) .................. 2012-133808

(51) Int. Cl.
*C09K 3/14* (2006.01)
*C01F 17/00* (2006.01)
(Continued)

(52) U.S. Cl.
CPC ........ *C09K 3/1436* (2013.01); *C01F 17/0043* (2013.01); *C09G 1/02* (2013.01);
(Continued)

(58) Field of Classification Search
CPC ...... C09K 3/14; C09K 3/1436; C09K 3/1463; C09G 1/00; C09G 1/02
See application file for complete search history.

(56) References Cited

U.S. PATENT DOCUMENTS 5,429,647 A * 7/1995 Larmie ............... C04B 35/1115
51/295
7,687,401 B2 * 3/2010 Feng .................. C09G 1/02
438/692

(Continued)

FOREIGN PATENT DOCUMENTS

CN 102268236 A * 12/2011 ............... C09K 3/14
CN 102352186 2/2012
(Continued)

OTHER PUBLICATIONS

Espacenet Machine Translation of 102268236 A.*
(Continued)

*Primary Examiner* — Jennifer A Smith
*Assistant Examiner* — Alexander M Moore
(74) *Attorney, Agent, or Firm* — Cozen O'Connor

(57) ABSTRACT

In order to use less cerium oxide and achieve higher durability and polishing speeds, these abrasive particles used in an abrasive have: a shell layer (3) which is the outermost shell layer of the abrasive particles and is formed with cerium oxide as the main component; and a middle layer (2) which contains cerium oxide and an oxide of at least one element selected from Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and the alkali earth metals, and which is formed closer to the center of the abrasive particles than the shell layer (3).

8 Claims, 7 Drawing Sheets

(51) Int. Cl.
*C09G 1/02* (2006.01)
*B24B 37/00* (2012.01)
*H01L 21/304* (2006.01)
*B24D 3/00* (2006.01)

(52) U.S. Cl.
CPC .......... *C09K 3/1409* (2013.01); *C09K 3/1463* (2013.01); *B24B 37/00* (2013.01); *B24D 3/00* (2013.01); *H01L 21/304* (2013.01)

(56) References Cited

U.S. PATENT DOCUMENTS

| | | | |
|---|---|---|---|
| 2007/0254484 A1 | 11/2007 | Feng et al. | |
| 2012/0065312 A1* | 3/2012 | Ishihara | B82Y 30/00 524/403 |

FOREIGN PATENT DOCUMENTS

| | | |
|---|---|---|
| JP | 2002-356312 | 12/2002 |
| JP | 2003-277732 | 10/2003 |
| JP | 2004-002723 | 1/2004 |
| JP | 2012-011525 | 1/2012 |
| JP | 2012-011526 | 1/2012 |
| JP | 2013-129056 | 7/2013 |

OTHER PUBLICATIONS

Aiken et al. "Preparation and Properties of Monodispersed Colloidal Particles of Lanthanide Compounds; III, Yttrium (III) and Mixed Yttrium(III)/Cerium(III) Systems". J. Am. Ceram. Soc. 71 (10) 845-53 (1988).*

B Aiken et al., "Preparation and Properties of Monodispersed Colloidal Particles of Lanthanide Compounds: III, Yttrium (III) and Mixed Yttrium (III)/Cerium (III) Systems", Journal of the America Ceramic Society, vol. 71, No. 10, pp. 845-853, 1988.

Office dated Oct. 18, 2016 which issued in the corresponding Japanese Patent Application No. 2014-521315.

* cited by examiner

ABRASIVE PARTICLES AND PRODUCTION METHOD THEREOF

RELATED APPLICATIONS

This is a U.S. National Phase Application under 35 USC 371 of International Application PCT/JP2013/065939 filed on Jun. 10, 2013.

This application claims the priority of Japanese application no. 2012-133808 filed Jun. 13, 2012, the entire content of which is hereby incorporated by reference.

TECHNICAL FIELD

The present invention relates to abrasive particles and a method of producing the abrasive particles.

BACKGROUND ART

In precision polishing in processes of producing glass optical elements, glass substrates, and semiconductor devices, abrasive materials composed of oxides of rare earth elements, mainly composed of cerium oxide and additionally containing lanthanum oxide, neodymium oxide, praseodymium oxide, and/or oxides of other rare earth elements, have been traditionally used. Although other abrasive materials, for example, diamond, iron oxide, aluminum oxide, zirconium oxide, and colloidal silica are also known, cerium oxide has been widely used from the viewpoint of the high polishing rate and the surface flatness of polished workpieces. However, cerium oxide is unevenly distributed over the world and has not been stably supplied. Accordingly, there is a demand for establishing a method of producing an abrasive material that allows polishing with high accuracy in spite of a low cerium oxide content.

A typical method of producing a high-purity cerium oxide abrasive material for precision polishing in, for example, an optical glass-producing process, involves addition of a salt such as carbonate, oxalate, or acetate to an aqueous solution of, for example, purified cerous nitrate, cerous chloride, or cerous sulfate to precipitate the product such as cerous carbonate, cerous oxalate, or cerous acetate; collection of the precipitate by filtration; and drying then firing the precipitate to give cerium oxide.

For example, Non-Patent Literature 1 proposes a method of preparing particles having a narrow particle size distribution by heating an aqueous solution mixture of an aqueous solution of cerium nitrate, a solution of yttrium nitrate, and urea with stirring.

Patent Literature 1 describes an abrasive material including composite abrasive particles each having a core layer that is a base particle composed of an inorganic material having a specific gravity smaller than that of cerium oxide and a shell layer that is composed of microparticles, having a particle diameter smaller than that of the base particle and containing cerium oxide, bonded onto the surface of the base particle with a binder. According to the description, this abrasive material is produced by a method including a first preparation step of preparing a first mixture by adding aluminum oxide sol serving as a binder to a dispersion of silicon oxide particles as base particles with stirring; a second preparation step of preparing a second mixture by adding a dispersion of cerium oxide particles to the first mixture with stirring; a solid-liquid separation step of separating the solid composed of the base particles (silicon oxide) and the microparticles (cerium oxide) bonded to the base particles via the binder (aluminum oxide) formed in the second preparation step; a firing step of firing the separated solid at 700° C. to 900° C.; and a powdering step of pulverizing the resulting fired product with a dry jet mill. In this method, a polishing accuracy and a polishing rate equivalent to those of conventional products can be achieved, while the amount of cerium oxide to be used being reduced, by using particles each having a core-shell structure composed of a base particle (core layer) composed of silicon oxide and a shell layer containing cerium oxide bonded onto the surface of the base particle with a binder.

PRIOR ART DOCUMENT

Patent Literature

Patent Literature 1: Japanese Patent Application Laid-Open Publication No. 2012-11525

Non-Patent Literature

Non-Patent Literature 1: J. Am. Ceram. Soc., Vol. 71, No. 10, pp. 845-853, (1988)

SUMMARY OF INVENTION

Problems to be Solved by the Invention

The particles produced by the method of Non-Patent Literature 1 were fired, and the fired product as an abrasive material was tested. Unfortunately, the polishing rate was low. The low polishing rate is caused by a reduction in cerium concentration on the particle surface due to an element other than cerium (yttrium) mixed in the raw material for adjusting the shape and size distribution of the particles.

In the abrasive material containing cerium oxide bound with the binder of Patent Literature 1, the abrasive particles themselves are broken with time due to the pressure applied to the abrasive particles through the application of a pressure to a polishing composition for applying a friction force to the workpiece in the polishing process. Such breakage leads to a reduction in polishing rate.

An object of the present invention, which has been made in view of the above circumstances, is to provide abrasive particles composed of a reduced amount of cerium oxide and having higher durability and a high polishing rate, and a method of producing the abrasive particles.

Means for Solving the Problem

In order to solve the above-described problems, the invention according to Aspect 1 provides:

an abrasive particle to be used as an abrasive material, including:

a shell layer being an outermost layer of the abrasive particle and mainly composed of cerium oxide; and an intermediate layer containing cerium oxide and an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and formed on an inner side of the shell layer of the abrasive particle.

The invention according to Aspect 2 provides the abrasive particle according to Aspect 1, further including:

a core layer formed on an inner side of the intermediate layer of the abrasive particle and including a center of the abrasive particle, wherein the core layer is mainly composed of an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals.

The invention according to Aspect 3 provides the abrasive particle according to Aspect 2, wherein the intermediate layer contains a same oxide as that being the main component of the core layer.

The invention according to Aspect 4 provides the abrasive particle according to Aspect 2 or 3, wherein the intermediate layer has a concentration gradient of cerium oxide decreasing from a shell layer side toward a core layer side.

The invention according to Aspect 5 provides the abrasive particle according to any one of Aspects 1 to 3, wherein the intermediate layer contains the cerium oxide and the oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals at substantially uniform concentrations.

The invention according to Aspect 6 provides the abrasive particle according to any one of Aspects 1 to 5, wherein the abrasive particle is a spherical particle.

The method of producing abrasive particles according to Aspect 7 includes:

an intermediate layer-forming step of forming an intermediate layer containing a Ce salt and a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals;

a shell layer-forming step of forming a shell layer mainly composed of a Ce salt on an outer surface of the intermediate layer by adding an aqueous solution containing a Ce salt to a second dispersion containing the dispersed particles as the intermediate layer of the salts formed in the intermediate layer-forming step;

a solid-liquid separation step of separating the solid being an abrasive material precursor from a third dispersion prepared in the shell layer-forming step; and a firing step of firing the abrasive material precursor prepared in the separation step in the air or in an oxidizing atmosphere.

The method of producing abrasive particles according to Aspect 8 includes:

a core layer-forming step of forming a core layer mainly composed of a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals through formation of the salt;

an intermediate layer-forming step of forming an intermediate layer containing a Ce salt and a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals on an outer surface of the core layer by adding an aqueous solution containing at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and an aqueous solution containing a Ce salt to a first dispersion containing the dispersed particles of the salt of the element formed in the core layer-forming step;

a shell layer-forming step of forming a shell layer mainly composed of a Ce salt on an outer surface of the intermediate layer by adding an aqueous solution containing a Ce salt to a second dispersion containing the dispersed particles provided with the intermediate layer of the salts formed in the intermediate layer-forming step;

a solid-liquid separation step of separating the solid being an abrasive material precursor from a third dispersion prepared in the shell layer-forming step; and a firing step of firing the abrasive material precursor prepared in the separation step in the air or in an oxidizing atmosphere.

The invention according to Aspect 9 provides the method of producing abrasive particles according to Aspect 7 or 8, wherein the intermediate layer-forming step uses the aqueous solution containing a Ce salt and the aqueous solution containing a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals such that the intermediate layer contains the Ce salt and the salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals at substantially uniform concentrations.

The invention according to Aspect 10 provides the method of producing abrasive particles according to Aspect 7 or 8, wherein the intermediate layer-forming step performs the addition of the aqueous solution containing a Ce salt such that the intermediate layer has a concentration gradient of the Ce salt decreasing according to a distance from an outer side of an abrasive particle toward a center of the abrasive particle.

The invention according to Aspect 11 provides the method of producing abrasive particles according to Aspect 7, wherein the salts formed in the intermediate layer-forming step and the shell layer-forming step are basic carbonates.

The invention according to Aspect 12 provides the method of producing abrasive particles according to Aspect 11, wherein the intermediate layer-forming step forms an intermediate layer containing a basic carbonate of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and basic carbonate of Ce by adding a urea compound to an aqueous solution containing at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and an aqueous solution containing a Ce salt.

The invention according to Aspect 13 provides the method of producing abrasive particles according to Aspect 8, wherein the salts formed in the core layer-forming step, the intermediate layer-forming step, and the shell layer-forming step are basic carbonates.

The invention according to Aspect 14 provides the method of producing abrasive particles according to Aspect 13, wherein the core layer-forming step forms a core layer mainly composed of a basic carbonate of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals by adding a urea compound to an aqueous solution containing at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals.

Advantageous Effects of Invention

The present invention can reduce the amount of cerium oxide to be used and can achieve higher durability and a high polishing rate.

EMBODIMENT FOR CARRYING OUT THE INVENTION

Known abrasive materials, and inventive abrasive particles and inventive methods of producing the abrasive particles will now be described in detail.

<Abrasive Material>

A typical abrasive material is a slurry of abrasive particles of, for example, iron oxide ($\alpha Fe_2O_3$), cerium oxide, aluminum oxide, manganese oxide, zirconium oxide, or colloidal silica prepared by dispersing the particles in water or oil. The present invention relates to novel abrasive particles to be used in an abrasive material mainly composed of cerium oxide that can be applied to chemical mechanical polishing (CMP) that polishes a workpiece by physical and chemical actions for achieving a sufficiently high polishing rate, while maintaining a flatness with high accuracy in the process of polishing a semiconductor device or glass. The present invention also relates to a method of producing the abrasive particles. The details will now be described.

<Three-Layer Structure of Abrasive Particle>

Figure 1:
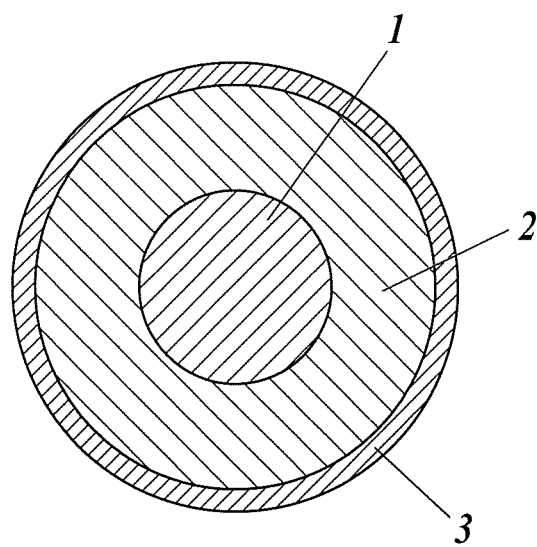
FIG. 1 is a schematic diagram illustrating a three-layer structure of an abrasive particle of an embodiment according to the present invention.
Figure 2A:
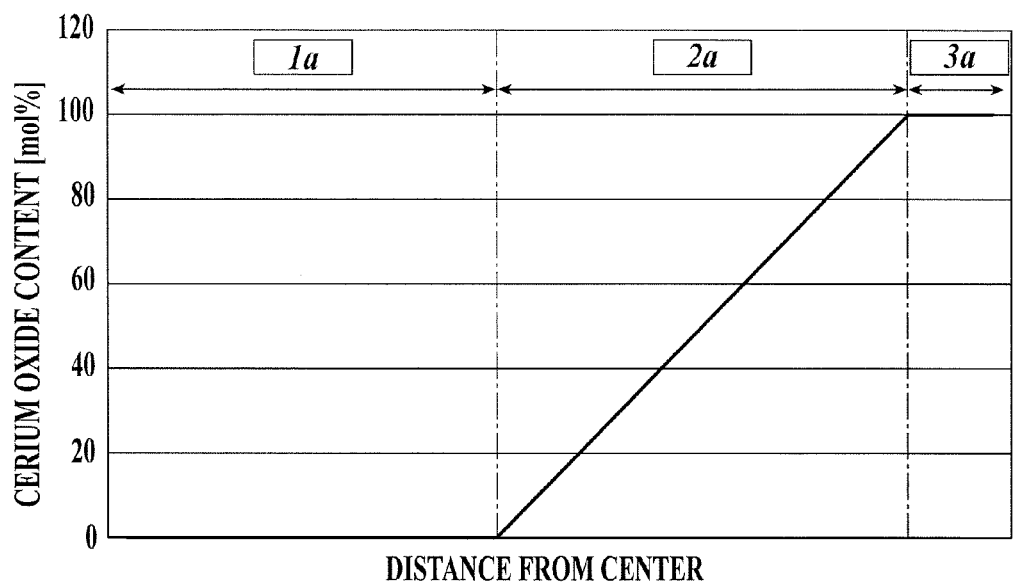
FIG. 2A is a graph schematically showing a composition of the three-layer structure of an abrasive particle of an embodiment according to the present invention.
Figure 2B:
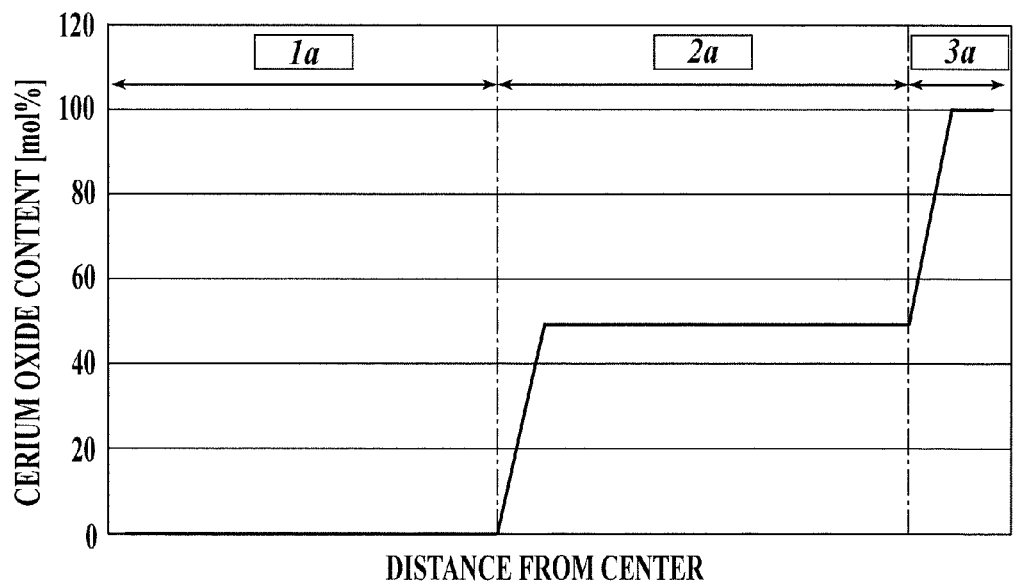
FIG. 2B is a graph schematically showing a composition of the three-layer structure of an abrasive particle of an embodiment according to the present invention.

The abrasive particle according to the present invention most preferably has a three-layer structure consisting of a core layer 1, an intermediate layer 2, and a shell layer 3. Specifically, as shown in FIG. 1, an abrasive particle having a three-layer structure is composed of a core layer 1 mainly composed of yttrium oxide, an intermediate layer 2 including yttrium oxide and cerium oxide on the outer surface of the core layer 1, and a shell layer 3 mainly composed of cerium oxide on the outer surface of the intermediate layer 2. For example, the core layer region 1a of the abrasive particle having a three-layer structure shown in FIG. 2A does not substantially contain cerium oxide and is mainly composed of yttrium oxide. Specifically, the core layer region 1a may contain cerium oxide at a proportion equal to or less than that of cerium oxide contained in the intermediate layer region 2a on the outer surface of the core layer region 1a. The composition of the intermediate layer region 2a varies such that the content of cerium oxide decreases from the outer side (adjacent the shell layer region 3a) of the intermediate layer region 2a toward the inner side (adjacent the core layer region 1a) of the intermediate layer region 2a at a constant concentration gradient. The intermediate layer region 2a may contain cerium oxide at a proportion equal to or higher than that of cerium oxide contained in the core layer region 1a and equal to or less than that of cerium oxide contained in the shell layer region 3a. The shell layer region 3a on the outer surface of the intermediate layer region 2a contains cerium oxide at a proportion of approximately 100 mol %. Specifically, the proportion of cerium oxide contained in the shell layer region 3a is preferably 50 to 100 mol %, in particular, preferably 75 mol % or more. A high polishing rate due to cerium oxide can be exhibited by increasing the concentration of cerium oxide contained in the shell layer region 3a serving as the surface of abrasive particle toward 100 mol %. The three-layer structure of the abrasive particle may be one as shown in FIG. 2B. The intermediate layer 2 preferably contains approximately constant concentrations of cerium oxide and, for example, yttrium oxide (e.g., a variation within a range of ±5 mol %). That is, in the intermediate layer region 2a, the (concentration) ratio of yttrium oxide to cerium oxide contained in the intermediate layer region 2a is constant regardless of the distance from the center of the abrasive particle, for example, at approximately 1:1.

Figure 2C:
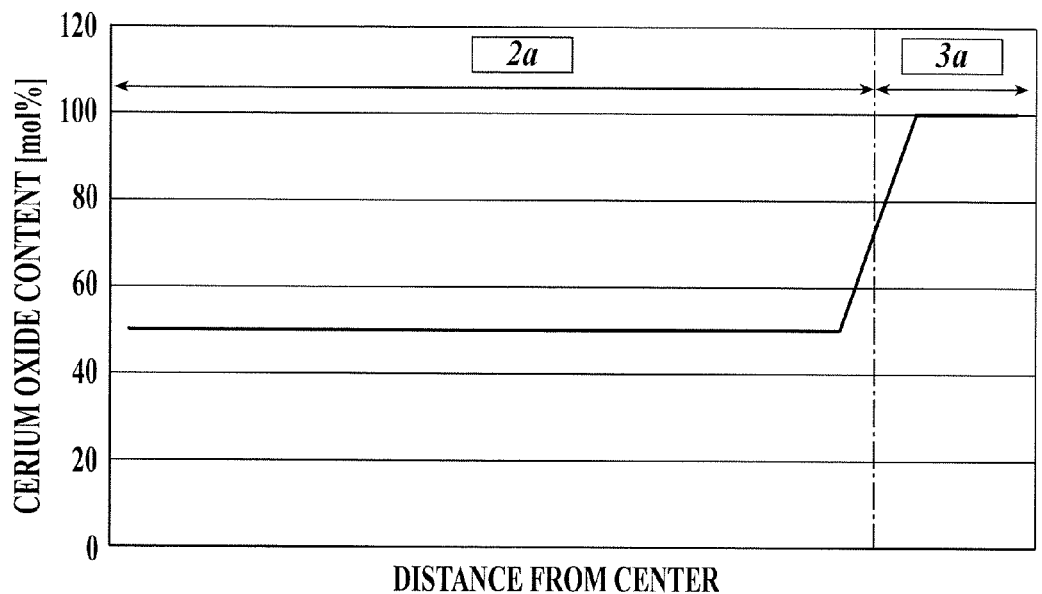
FIG. 2C is a graph schematically showing a composition of the two-layer structure of an abrasive particle of an embodiment according to the present invention.
Figure 2D:
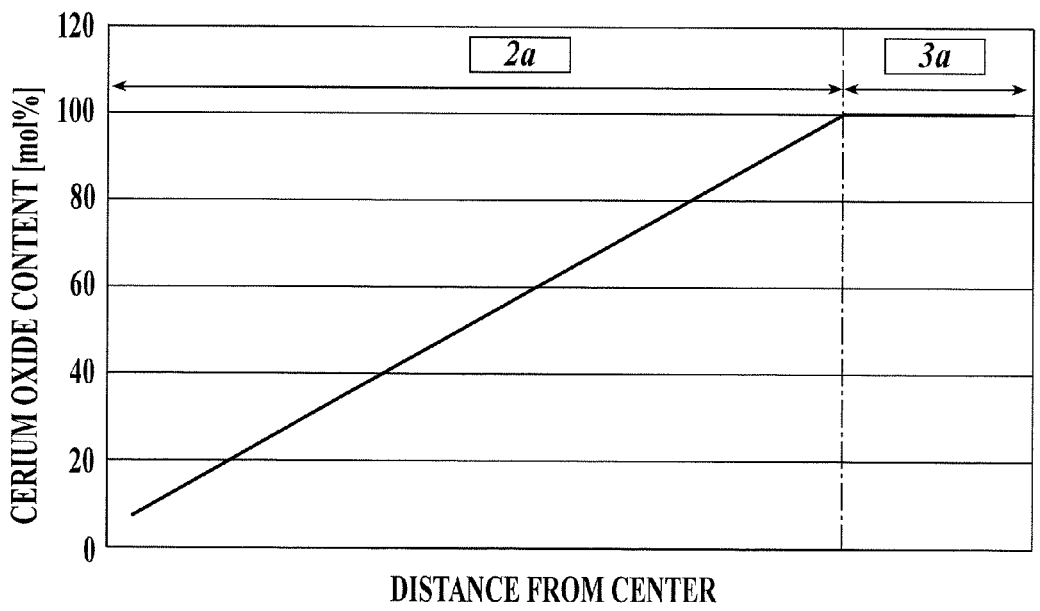
FIG. 2D is a graph schematically showing a composition of the two-layer structure of an abrasive particle of an embodiment according to the present invention.

The abrasive particle may have two layers: a substantially integrated layer including the core layer region 1a and the intermediate layer region 2a and a layer of the shell layer region 3a mainly composed of cerium oxide. For example, as shown in FIG. 2C, there is no difference between the intermediate layer 2 and the core layer 1. That is, the abrasive particle may have a structure including an intermediate layer region 2a not having a boundary with the core layer 1 and including yttrium oxide and cerium oxide at a ratio of 1:1 and a shell layer region 3a mainly composed of cerium oxide on the outer surface of the intermediate layer region 2a. The intermediate layer region 2a formed as the substantially integrated layer including the intermediate layer 2 and the core layer 1 may have a prescribed concentration gradient of cerium oxide. Specifically, as shown in FIG. 2D, the structure has a composition varying (the cerium oxide content decreasing) from the shell layer region 3a side toward the center side of the abrasive particle at a constant concentration gradient. An oxide including yttrium oxide, of which particles are barely broken by stress applied in use, has been described above as an example of the oxide contained in the abrasive particles. In addition to the above, preferred is an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals. The element contained as the main component in the core layer 1 of an abrasive particle is preferably an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and is preferably the same as the oxide of an element contained in the intermediate layer 2 for maintaining the bonding strength between the layers, but any other element may also be used. For example, the oxides contained in the core layer 1 and the intermediate layer 2 may be oxides of different elements selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals.

<Method of Producing Abrasive Particles>

A method of producing abrasive particles having a three-layer structure will now be described, but the method is not limited thereto and may produce abrasive particles having a two-layer structure not having a difference between the core layer 1 and the intermediate layer 2.

Figure 3:
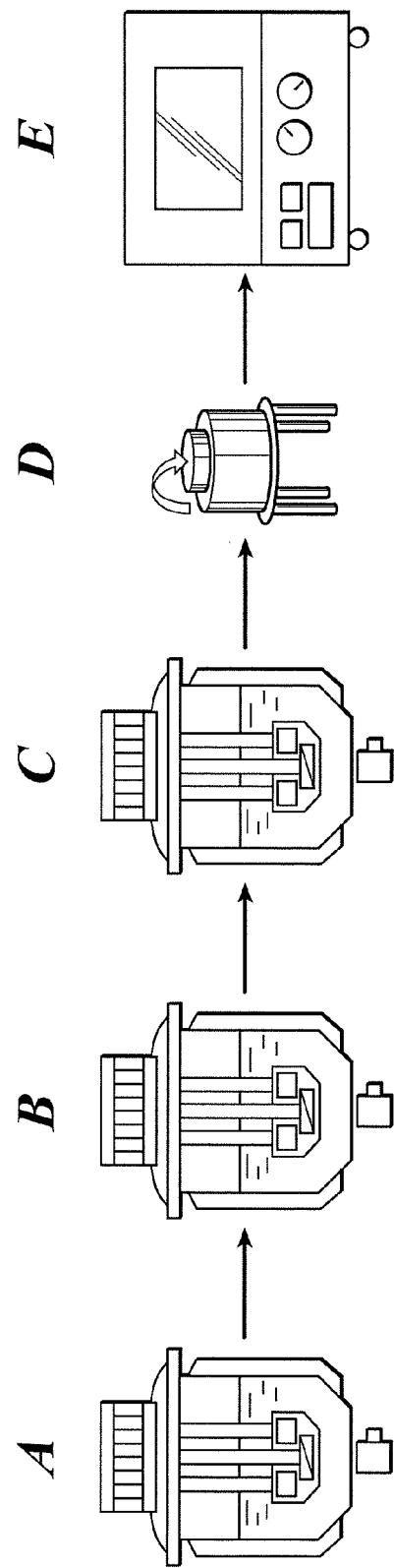
FIG. 3 is a schematic diagram illustrating a flow of the abrasive particle-producing process of an embodiment according to the present invention.

The method of producing abrasive particles of the present invention roughly includes the following five steps (see FIG. 3).

1. Core Layer-Forming Step

In core layer-forming step A, a first dispersion containing a dispersed basic carbonate of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals is prepared by adding a urea compound to an aqueous solution containing a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals. The salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals may be, for example, nitrate, hydrochloride, or sulfate, and preferred is nitrate. Examples of the urea compound include urea, salts of urea (e.g., nitrate and hydrochloride), N,N'-dimethylacetylurea, N,N'-dibenzoylurea, benzenesulfonylurea, p-toluenesulfonylurea, trimethylurea, tetraethylurea, tetramethylurea, triphenylurea, tetraphenylurea, N-benzoylurea, methylisourea, and ethylisourea, and preferred is urea. In core layer-forming step A shown in the following embodiment, basic carbonate is formed with urea, but is merely an example, and the present invention should not be limited to the example.

The ion concentration in the aqueous solution of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals is preferably 0.001 to 0.1 mol/L, and the concentration of urea is preferably 5 to 50 times the ion concentration. Spherical abrasive particles showing monodispersion can be synthesized by controlling the ion concentration of the at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals in the aqueous solution and the ion concentration of urea within the above-mentioned ranges.

The mixture of the aqueous solutions is heated at 80° C. or higher with stirring to allow the growth of basic carbonate forming a core layer 1 dispersed in an aqueous solution (hereinafter, referred to as first dispersion).

The mixer in the heating and stirring may have any shape and other factors that can provide a sufficient stirring efficiency. In order to achieve a higher stirring efficiency, a mixer of a rotor stator type is preferably used.

2. Intermediate Layer-Forming Step

In intermediate layer-forming step B, an aqueous solution containing a salt of an element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals (which is contained in the core layer-forming step A), for example, yttrium nitrate and an aqueous solution containing a Ce salt are added to the first dispersion containing the basic carbonate formed in core layer-forming step A. Subsequently, for example, the core layer 1 is subjected to particle growth by forming an intermediate layer 2 composed of a mixture of yttrium and cerium on the outer surface of the core layer 1 composed of the basic carbonate of yttrium to increase the diameter of the basic carbonate particle. Specifically, an aqueous solution is preferably added to the first dispersion at an addition rate of 0.003 to 3.0 mmol/L per min. In particular, the proportion of Ce in the aqueous solution is preferably less than 90 mol %. If the addition rate and the proportion of Ce in the solution are outside the ranges, it is difficult to form spherical abrasive particles showing monodispersion. The first dispersion is preferably heated at 80° C. or higher with stirring when the aqueous solution is added thereto at the above-mentioned rate. If the mixture is stirred at 80° C. or lower, the urea added in the core layer-forming step A is not decomposed, resulting in preclusion of particle formation. The dispersion including dispersed particles each including the intermediate layer 2 on the outer surface of the core layer 1 is referred to as a second dispersion.

3. Shell Layer-Forming Step

In shell layer-forming step C, the particles are subjected to further growth through formation of a shell layer 3 mainly composed of basic carbonate of Ce on the outer surface of the intermediate layer 2 by adding an aqueous solution including a Ce salt to the second dispersion including the dispersed particles each including the intermediate layer 2 on the outer surface of the core layer 1 formed in the intermediate layer-forming step B. The aqueous solution containing a Ce salt is preferably added at an addition rate of 0.003 to 3.0 mmol/L per min with stirring and heating at 80° C. or higher. If the addition rate is outside the range, it is difficult to form spherical abrasive particles showing monodispersion. If the stirring is performed at 80° C. or lower, as in the intermediate layer-forming step B, the urea added in the core layer-forming step A is not decomposed, resulting in preclusion of particle formation. The dispersion containing dispersed particles each including the shell layer 3 on the outer surface of the intermediate layer 2 is referred to as a third dispersion.

4. Solid-Liquid Separation Step

In solid-liquid separation step D, the solid including the shell layer 3 on the outer surface of the intermediate layer 2 is collected from the third dispersion prepared in the shell layer-forming step C by a solid-liquid separation procedure to obtain an abrasive material precursor. In the solid-liquid separation step D, the resulting abrasive material precursor is optionally dried and may be then subjected to the firing step.

5. Firing Step

In firing step E, the abrasive material precursor of the basic carbonate obtained by the solid-liquid separation is fired in the air or in an oxidizing atmosphere at 400° C. or higher. The abrasive material precursor is converted into an oxide by the firing to give abrasive particles having surfaces covered with cerium oxide.

<Particle Diameter, Polishing Rate, and Surface Accuracy of Abrasive Material>

The particle diameter required in abrasive particles varies depending on the use of the particles. A reduction in particle diameter of the abrasive particles contained in an abrasive material is required with an increase in finished surface accuracy after polishing. For example, a process of producing a semiconductor device requires an average particle diameter of 2.0 µm or less. The polishing rate tends to decrease with a reduction in particle diameter of an abrasive material, whereas the finished surface accuracy after polishing increases with a reduction in particle diameter. Accordingly, a particle diameter of less than 0.02 µm cannot achieve the advantage, i.e., a higher polishing rate of the cerium-based abrasive material compared to those of other abrasive materials such as colloidal silica. Accordingly, the abrasive particles preferably have an average particle diameter within a range of 0.02 to 2.0 µm, more preferably within a range of 0.05 to 1.5 µm.

In order to enhance the surface accuracy after the polishing process, it is desirable to use an abrasive material having particle diameters as uniform as possible and having a low coefficient of variation of particle size distribution.

<Use and Deterioration of Abrasive Material>

A method of using the abrasive material will now be described by a polishing process of a glass substrate for an information recording disk as an example.

1. Preparation of Abrasive Slurry

A slurry of an abrasive material is produced by adding a powder of abrasive particles to a solvent such as water. Aggregation is prevented by adding, for example, a dispersant to the abrasive slurry, and the dispersion state is maintained by constantly stirring the slurry with a mixer or the like. The slurry of the abrasive material is circularly supplied to a grinder with a supply pump.

2. Polishing Step

A glass substrate is brought into contact with the upper and lower surface plates of a grinder provided with polishing pads (polishing cloth). Polishing is performed by relatively moving the pads and the glass under a pressurized condition, while the slurry of the abrasive material being supplied to the contact surfaces.

3. Deterioration of Abrasive Material

The abrasive material is used under a pressurized condition as described in the polishing step. Accordingly, the abrasive particles contained in the abrasive material are gradually disintegrated with elapse of the polishing time and are reduced in size. The reduction in size of the abrasive particles causes a reduction in polishing rate. Accordingly, abrasive particles showing a smaller change in particle size distribution between before and after the polishing are desired.

EXAMPLES

The present invention will now be specifically described by way of examples and comparative examples, but should not be construed to limit the scope of the invention in any way.

Example 1: Abrasive Material 1

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. A pre-prepared mixture of 300 mL of aqueous yttrium nitrate solution (0.08 mol/L) and 300 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 2: Abrasive Material 2

Step 1. Urea was added to 10 L of aqueous yttrium nitrate solution (0.05 mol/L) into a urea concentration of 1.0 mol/L. The mixture was sufficiently stirred and was then heated at 90° C. for 1 hour with stirring.

Step 2. A pre-prepared mixture of 300 mL of aqueous yttrium nitrate solution (0.08 mol/L) and 300 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 3: Abrasive Material 3

Step 1. Urea was added to 10 L of aqueous yttrium nitrate solution (0.1 mol/L) into a urea concentration of 2.0 mol/L. The mixture was sufficiently stirred and was then heated at 90° C. for 1 hour with stirring.

Step 2. A pre-prepared mixture of 300 mL of aqueous yttrium nitrate solution (0.08 mol/L) and 300 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 4: Abrasive Material 4

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. A pre-prepared mixture of 300 mL of aqueous yttrium nitrate solution (0.2 mol/L) and 300 mL of aqueous cerium nitrate solution (1.8 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 5: Abrasive Material 5

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. A pre-prepared mixture of 300 mL of aqueous yttrium nitrate solution (0.08 mol/L) and 300 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (2.0 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 6: Abrasive Material 6

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. 300 mL of aqueous yttrium nitrate solution (0.4 mol/L) and 200 mL of aqueous cerium nitrate solution (0.4 mol/L) were added to the dispersion prepared in Step 1 at addition rates of (10-0.16 t) mL/min and (0.16 t) mL/min, respectively, with heating at 90° C. and stirring, where t represents time (min).

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 7: Abrasive Material 7

Step 1. Urea was added to 10 L of aqueous nitric acid solution containing 0.005 mol/L of yttrium and 0.005 mol/L of cerium into a urea concentration of 0.20 mol/L. The mixture was sufficiently stirred and was then heated at 90° C. for 1 hour with stirring.

Step 2. A pre-prepared mixture of 600 mL of aqueous yttrium nitrate solution (0.08 mol/L) and 600 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 8: Abrasive Material 8

Step 1. Urea was added to 10 L of an aqueous yttrium nitrate solution (0.125 mol/L) into a urea concentration of 2.5 mol/L. The mixture was sufficiently stirred and was then heated at 90° C. for 1 hour with stirring.

Step 2. A pre-prepared mixture of 300 mL of aqueous yttrium nitrate solution (0.08 mol/L) and 300 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 9: Abrasive Material 9

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. A pre-prepared mixture of 300 mL of aqueous yttrium nitrate solution (0.04 mol/L) and 300 mL of aqueous cerium nitrate solution (0.36 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 10: Abrasive Material 10

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. A pre-prepared mixture of 300 mL of aqueous yttrium nitrate solution (0.8 mol/L) and 300 mL of aqueous cerium nitrate solution (3.2 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Example 11: Abrasive Material 11

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. A pre-prepared mixture of 300 mL of aqueous yttrium nitrate solution (0.08 mol/L) and 300 mL of aqueous cerium nitrate solution (0.32 mol/L) was added to the dispersion prepared in Step 1 at an addition rate of 10 mL/min with heating at 90° C. and stirring.

Step 3. 50 mL of aqueous cerium nitrate solution (4.0 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

Comparative Example 1: Abrasive Material 12

Step 1. Urea was added to 10 L of water into a urea concentration of 0.20 mol/L. The mixture was sufficiently stirred and was then heated to 90° C. with stirring.

Step 2. A pre-prepared mixture of 600 mL of aqueous yttrium nitrate solution (0.08 mol/L) and 600 mL of aqueous cerium nitrate solution (0.32 mol/L) was added to the dispersion prepared in Step 1 at an addition rate of 10 mL/min with heating at 90° C. and stirring.

Step 3. The abrasive material precursor precipitated from the dispersion prepared in Step 2 was collected with a membrane filter and was fired at 600° C. to yield abrasive particles.

Comparative Example 2: Abrasive Material 13

Step 1. Urea was added to 10 L of aqueous yttrium nitrate solution (0.01 mol/L) into a urea concentration of 0.20 mol/L. The mixture was sufficiently stirred and was then heated at 90° C. for 1 hour with stirring.

Step 2. 600 mL of aqueous yttrium nitrate solution (0.40 mol/L) was added to the dispersion prepared in Step 1 at an addition rate of 10 mL/min with heating at 90° C. and stirring.

Step 3. 50 mL of aqueous cerium nitrate solution (0.4 mol/L) was added to the dispersion prepared in Step 2 at an addition rate of 10 mL/min with heating at 90° C. and stirring.

Step 4. The abrasive material precursor precipitated from the dispersion prepared in Step 3 was collected with a membrane filter and was fired at 600° C. to yield abrasive particles.

<Evaluation of Abrasive Materials>

Abrasive materials 1 to 13 were evaluated for the shape and polishing performance by the following methods.

1. Elemental Analysis

Figure 4A:
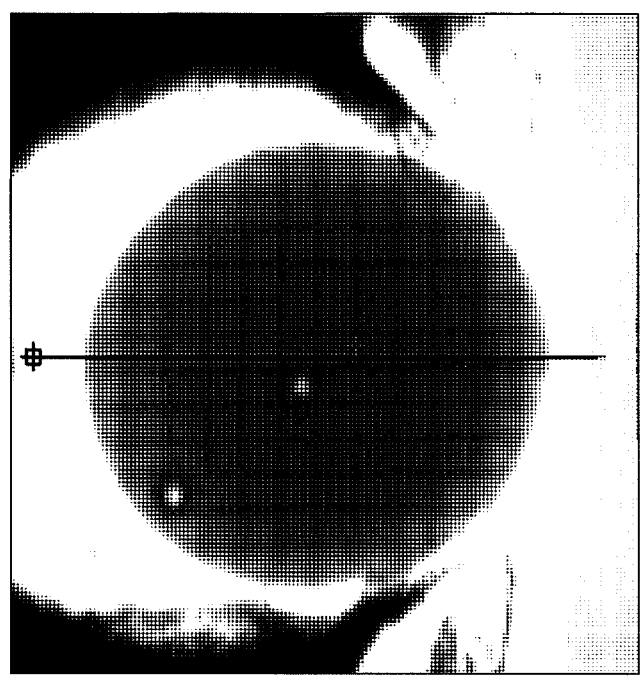
FIG. 4A is a photograph of a central region of an abrasive particle after sectioning of the present invention.
Figure 4B:
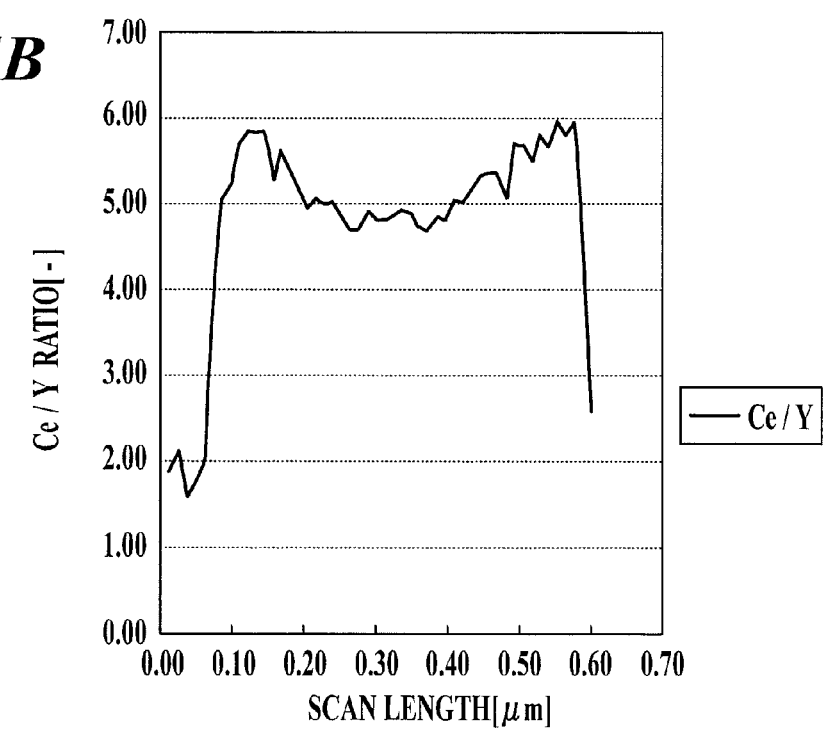
FIG. 4B shows the results of elemental analysis of the central region of an abrasive particle after sectioning of the present invention.

The abrasive particles were each sectioned with a focused ion beam system (FB-2000A: manufactured by Hitachi High-Technologies Corporation) to be cut at a plane including the central region of the particle. The cut surface was subjected to elemental analysis with a STEM-EDX system (HD-2000) manufactured by Hitachi High-Technologies Corporation to evaluate the distribution of particle composition. FIGS. 4A and 4B show the results of elemental analysis of abrasive particles of Example 7, as an example. As shown in FIG. 4A, in a cross section of the abrasive particle of Example 6, high cerium-to-yttrium ratios are observed at scan lengths of about 0.20 μm and about 0.60 μm, which are near the outer surface of the abrasive particle (see FIG. 4B).

2. Average Particle Diameter and Coefficient of Variation of Particle Diameter

The average particle diameter and the coefficient of variation of particle size distribution were determined from 100 abrasive particles in a scanning microscopic photograph (SEM image).

Figure 5A:
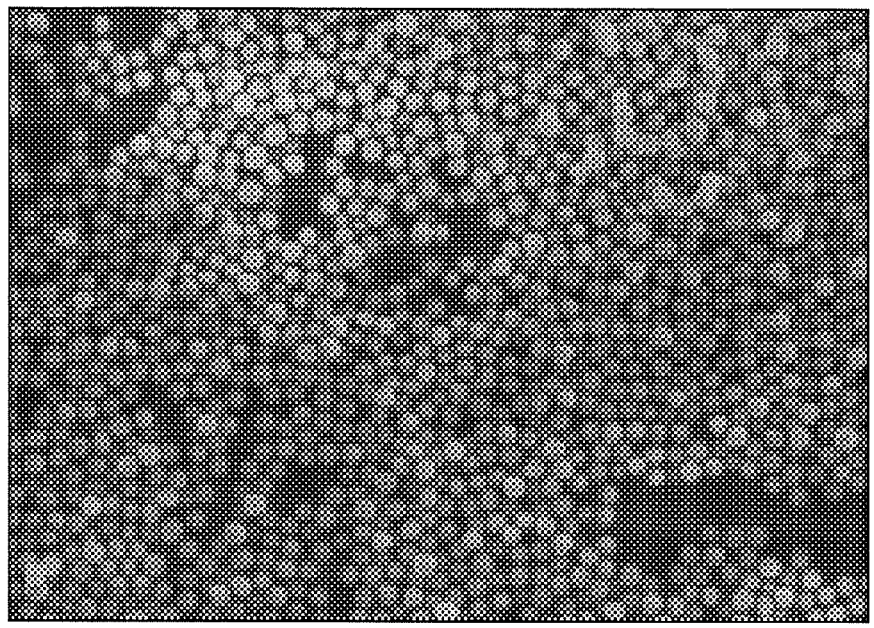
FIG. 5A is a scanning microscopic photograph of abrasive particles of the present invention.
Figure 5B:
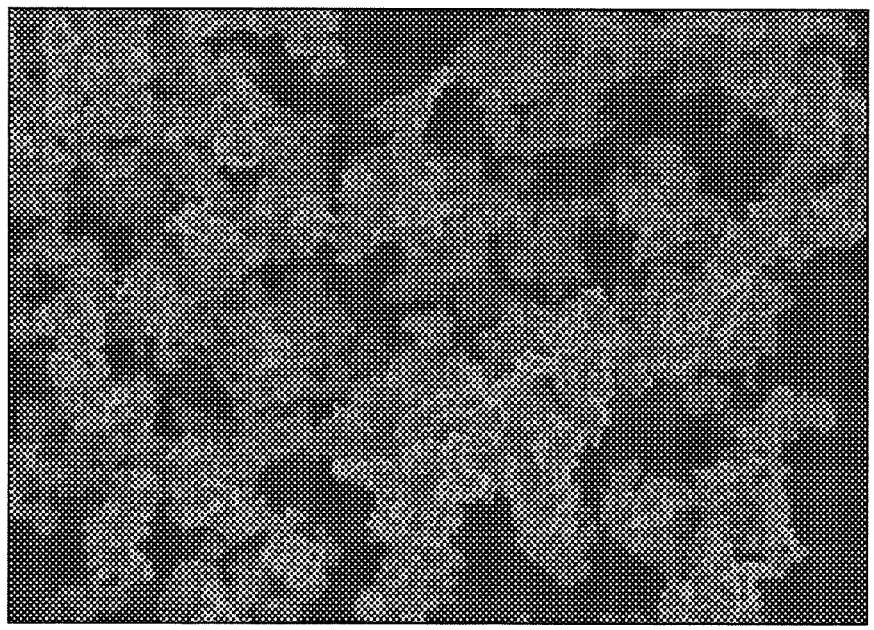
FIG. 5B is a scanning microscopic photograph of abrasive particles of the present invention.
Figure 5C:
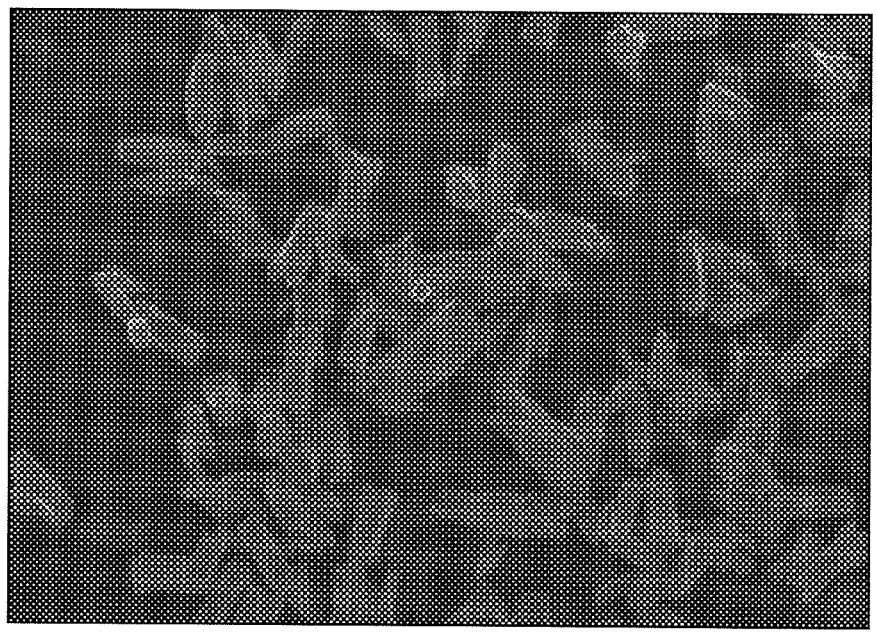
FIG. 5C is a scanning microscopic photograph of abrasive particles of the present invention.
Figure 5D:
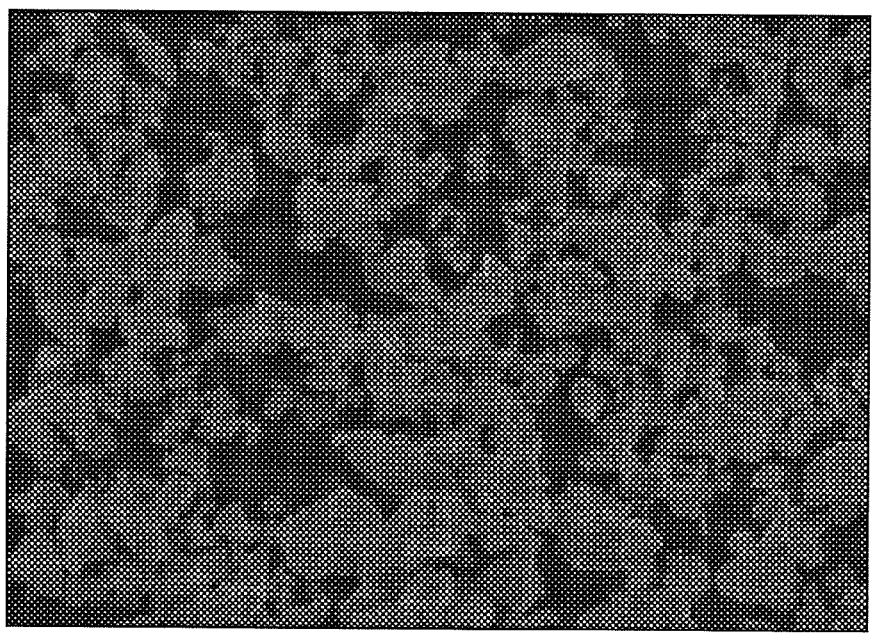
FIG. 5D is a scanning microscopic photograph of abrasive particles of the present invention.

FIGS. 5A to 5D show scanning microscopic photographs of 100 abrasive particles. FIG. 5A shows a state of monodispersed abrasive particles in a dispersion solvent. FIG. 5B shows a state of aggregated abrasive particles in a dispersion solvent. FIG. 5C shows a state of abrasive particles dispersed in a tabular form in a dispersion solvent. FIG. 5D shows a state of polydispersed abrasive particles in a dispersion solvent.

The coefficient of variation of particle size distribution was determined by the following expression:

Coefficient of variation (%)=(standard deviation of particle size distributions/average particle diameter)×100.

3. Polishing Rate

The grinder used in the polishing process polishes a workpiece surface with polishing cloth while supplying a slurry of an abrasive material prepared by dispersing a powder of the abrasive material including the abrasive particles in a solvent such as water to the workpiece surface. The abrasive slurry was prepared at a concentration of 100 g/L in water (not containing any other dispersion medium). In the polishing test, a glass substrate having a diameter of 65 mm was polished under circulated supply of the abrasive slurry at a flow rate of 5 L/min, using polyurethane polishing cloth, with an abrasion tester at a pressure of 9.8 kPa (100 g/cm$^2$) applied to the surface to be polished at a rotation rate of 100 min$^{-1}$ (rpm) for 30 min. The thicknesses before and after polishing were measured with Nikon Digimicro (MF501), and the polished amount (μm) per minute was calculated as the polishing rate from the change in thickness.

4. Investigation of Variation in Polishing Rate

The polishing by the method shown in the item "3. Polishing rate" was continuously repeated five times, and the variation in polishing rate between the first time and the fifth time was investigated. The polishing rate at the first time is referred to as polishing rate 1, and the polishing rate at the fifth time is referred to as polishing rate 2. The results are shown in Table 1.

<Evaluation of Shape and Polishing Performance of Abrasive Material>

Table 1 summarizes the results obtained in these evaluations.

TABLE 1

| ABRASIVE MATERIAL | EXAMPLE/ COMPARATIVE EXAMPLE | PARTICLE SHAPE | | | | POLISHING PERFORMANCE | |
|---|---|---|---|---|---|---|---|
| | | SHAPE | NUMBER OF LAYERS | AVERAGE PARTICLE DIAMETER [μm] | COEFFICIENT OF VARIATION[%] | POLISHING RATE 1 [μm/min] | POLISHING RATE 2 [μm/min] |
| 1 | EXAMPLE 1 | MONODISPERSION | THREE-LAYER | 0.40 | 11 | 0.52 | 0.49 |
| 2 | EXAMPLE 2 | MONODISPERSION | THREE-LAYER | 0.62 | 14 | 0.58 | 0.59 |
| 3 | EXAMPLE 3 | MONODISPERSION | THREE-LAYER | 0.75 | 19 | 0.66 | 0.63 |
| 4 | EXAMPLE 4 | MONODISPERSION | THREE-LAYER | 0.56 | 14 | 0.53 | 0.51 |
| 5 | EXAMPLE 5 | MONODISPERSION | THREE-LAYER | 0.43 | 16 | 0.48 | 0.42 |
| 6 | EXAMPLE 6 | MONODISPERSION | THREE-LAYER | 0.37 | 15 | 0.48 | 0.44 |
| 7 | EXAMPLE 7 | MONODISPERSION | THREE-LAYER | 0.38 | 19 | 0.41 | 0.40 |
| 8 | EXAMPLE 8 | AGGREGATION | THREE-LAYER | 3.62 | 58 | 0.88 | 0.65 |
| 9 | EXAMPLE 9 | TABULAR | THREE-LAYER | 5.69 | 65 | 1.67 | 1.32 |
| 10 | EXAMPLE 10 | AGGREGATION | THREE-LAYER | 4.24 | 63 | 0.98 | 0.62 |
| 11 | EXAMPLE 11 | TABULAR | THREE-LAYER | 5.02 | 61 | 1.49 | 1.25 |
| 12 | COMPARATIVE EXAMPLE 1 | MONODISPERSION | MONOLAYER | 0.40 | 13 | 0.32 | 0.30 |
| 13 | COMPARATIVE EXAMPLE 2 | MONODISPERSION | TWO-LAYER | 0.45 | 15 | 0.50 | 0.26 |

Each of the shapes shown in Table 1 is that observed in 100 abrasive particles in an SEM image. In addition, the average particle diameter (μm) was determined from 100 abrasive particles in the SEM image. The coefficient of variation is the coefficient of variation of particle size distribution determined by the above-mentioned expression.

As shown in Table 1, the abrasive particles prepared in Examples 1 to 7 of the present invention show monodispersion, have small average particle diameters, and also have low coefficients of variation. Regarding the polishing performance, the reduction in polishing rate is low in comparison between polishing rate 2, which is the polishing rate at the fifth time, and polishing rate 1, which results demonstrate high durability.

Although the abrasive particles prepared in Examples 8 to 11 each have a three-layer structure and show high polishing rates 1 and 2 in polishing performance, the abrasive particle shapes in Examples 1 to 7 are superior to those in Examples 8 to 11. Specifically, it is believed that in Example 8, the high yttrium concentration in the aqueous solution added in core layer-forming step A induces aggregation to increase the average particle diameter of the resulting abrasive particles; in Example 9, the high ratio of cerium to yttrium in the aqueous solution added to the first dispersion in intermediate layer-forming step B induces adhesion of cerium to yttrium to cause tabular growth of the abrasive particles; in Example 10, the high concentrations of yttrium and cerium added to the first dispersion in intermediate layer-forming step B induce aggregation of the resulting abrasive particles; and in Example 11, the high concentration of cerium in the aqueous solution added to the second dispersion in shell layer-forming step C causes tabular growth of the abrasive particles. Thus, abrasive particles showing monodispersion can be obtained by adjusting the concentrations of yttrium and cerium in aqueous solutions within the ranges in Examples 1 to 7 in each step. In addition, it is believed that in Examples 1 to 5 and 7, the abrasive particles have the three-layer structure as shown in FIG. 2B by adding the aqueous solution to the first dispersion at a constant rate without varying the addition rate in intermediate layer-forming step B and that in Example 6, the abrasive particles have the three-layer structure as shown in FIG. 2A by adding the aqueous solution to the first dispersion while varying the addition rate in intermediate layer-forming step B.

Meanwhile, in Comparative Example 1, the particle has a one-layer structure in which the ratio of yttrium to cerium in the outside portion of the abrasive particle is constant, and the proportion of cerium in the outside portion of the abrasive particle is lower than that in a three-layer structure. Accordingly, the polishing rate is inferior to those in Examples of three-layer structures. In also Comparative Example 2, since the particle has a two-layer structure including a core layer mainly composed of yttrium oxide and a shell layer mainly composed of cerium oxide, the bonding strength between the layers is low, and the comparison of polishing rate 1 and polishing rate 2 shows a significant decrease in the polishing rate compared to those in other examples. Thus, low durability is observed.

As described above, the abrasive particle of this embodiment includes a shell layer 3 being the outermost layer of the abrasive particle and mainly composed of cerium oxide and an intermediate layer 2 formed on the inner side of the shell layer 3 and containing cerium oxide and an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals. Accordingly, the amount of cerium oxide contained in the intermediate layer 2 on the inner side of the shell layer 3 can be reduced while a high polishing rate due to cerium oxide being maintained by using cerium oxide useful as an abrasive material on the outer surface of the abrasive particle. Specifically, the abrasive particle has a continuously variable composition from the intermediate layer 2 to the shell layer 3 and thereby has higher durability and can reduce the amount of cerium oxide, compared to abrasive particles including cerium oxide with no layer structure. In addition, the outside of the abrasive particle is entirely covered with a shell layer 3 composed of cerium oxide. Accordingly, the abrasive particle can have a higher polishing rate, compared to abrasive particles having surfaces composed of a mixture of cerium oxide and another compound.

The abrasive particle of another embodiment further includes a core layer 1 formed on the inner side of the intermediate layer 2 and including the center of the abrasive particle. The core layer 1 is mainly composed of an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals. The abrasive particle having a three-layer structure can reduce the amount of cerium oxide and can use an element, as the core layer 1, showing high resistance against the pressure applied during polishing.

In the intermediate layer 2, the concentration of cerium oxide decreases from the shell layer 3 side toward the core layer 1 side at a prescribed concentration gradient. Consequently, the bonding strength between the layers can be maintained, and the abrasive particles are barely broken and can maintain its high polishing rate, even if stress is applied to the abrasive particle during the polishing process.

The intermediate layer 2 contains the same oxide as that being the main component of the core layer 1. Accordingly, the component contained in the core layer 1 and the intermediate layer 2 can have continuity to maintain higher durability.

The intermediate layer 2 contains cerium oxide and an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals at approximately constant concentrations. Accordingly, no complicated step is required for forming the layer, and high durability can be maintained.

The abrasive particles are spherical and can have a large contact area with a workpiece in the polishing process.

INDUSTRIAL APPLICABILITY

The present invention can be used in the field of performing polishing with an abrasive material containing cerium oxide in the process of producing, for example, glass products, semiconductor devices, and crystal oscillators.

REFERENCE SIGNS LIST

1 core layer
1*a* core layer region
2 intermediate layer
2*a* intermediate layer region
3 shell layer
3*a* shell layer region
A core layer-forming step
B intermediate layer-forming step
C shell layer-forming step
D solid-liquid separation step
E firing step

The invention claimed is:

1. An abrasive particle to be used as an abrasive material, comprising:
   a shell layer being an outermost layer of the abrasive particle and mainly composed of cerium oxide;
   an intermediate layer containing cerium oxide and an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and formed on an inner side of the shell layer of the abrasive particle; and
   a core layer formed on an inner side of the intermediate layer of the abrasive particle and including a center of the abrasive particle,
   wherein the shell layer covers the entire intermediate layer, and the core layer is mainly composed of an oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals,
   wherein the intermediate layer contains the cerium oxide and the oxide of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals at a variation within a range of ±5 mol %.

2. The abrasive particle according to claim 1, wherein the intermediate layer contains a same oxide as that being the main component of the core layer.

3. The abrasive particle according to claim 1, wherein the intermediate layer has a concentration gradient of cerium oxide decreasing from a shell layer side toward a core layer side.

4. The abrasive particle according to claim 1, wherein the abrasive particle is a spherical particle.

5. A method of producing abrasive particles, comprising:
   forming a core layer mainly composed of a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals through formation of the salt;
   forming an intermediate layer containing a Ce salt and a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals on an outer surface of the core layer by adding an aqueous solution containing at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals and an aqueous solution containing a Ce salt to a first dispersion containing the dispersed particles of the salt of the element formed in the core layer-forming step;
   forming a shell layer mainly composed of a Ce salt on an outer surface of the intermediate layer by adding an aqueous solution containing a Ce salt to a second dispersion containing the dispersed particles provided with the intermediate layer of the salts formed in the intermediate layer-forming step;
   separating the solid being an abrasive material precursor from a third dispersion prepared in the shell layer-forming step; and
   firing the abrasive material precursor prepared in the separation step in the air or in an oxidizing atmosphere,
   wherein the intermediate layer-forming step uses the aqueous solution containing a Ce salt and the aqueous solution containing a salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals such that the intermediate layer contains the Ce salt and the salt of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals at a variation within a range of ±5 mol %.

6. The method of producing abrasive particles according to claim 5, wherein
   the intermediate layer-forming step performs the addition of the aqueous solution containing a Ce salt such that the intermediate layer has a concentration gradient of the Ce salt decreasing according to a distance from an outer side of an abrasive particle toward a center of the abrasive particle.

7. The method of producing abrasive particles according to claim 5, wherein the salts formed in the core layer-forming, the intermediate layer-forming, and the shell layer-forming are basic carbonates.

8. The method of producing abrasive particles according to claim 7, wherein the core layer-forming forms a core layer mainly composed of a basic carbonate of at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals by adding a urea compound to an aqueous solution containing at least one element selected from the group consisting of Al, Sc, Ti, V, Cr, Mn, Fe, Co, Ni, Cu, Zn, Ga, Ge, Zr, In, Sn, Y, Gd, Tb, Dy, Ho, Er, Tm, Yb, Lu, W, Bi, Th, and alkali earth metals.

* * * * *